United States Patent
Manninen et al.

(10) Patent No.: US 10,043,729 B1
(45) Date of Patent: Aug. 7, 2018

(54) POWER ELECTRONICS MODULE

(71) Applicant: ABB Technology Oy, Helsinki (FI)

(72) Inventors: Jorma Manninen, Vantaa (FI); Mika Silvennoinen, Espoo (FI); Kjell Ingman, Soderkulla (FI)

(73) Assignee: ABB Technology Oy, Helsinki (FI)

( * ) Notice: Subject to any disclaimer, the term of this patent is extended or adjusted under 35 U.S.C. 154(b) by 0 days.

(21) Appl. No.: 15/428,471

(22) Filed: Feb. 9, 2017

(51) Int. Cl.
*H01L 23/34* (2006.01)
*H01L 23/367* (2006.01)
*H01L 23/492* (2006.01)
*H01L 21/48* (2006.01)

(52) U.S. Cl.
CPC ...... *H01L 23/3672* (2013.01); *H01L 21/4871* (2013.01); *H01L 23/4924* (2013.01)

(58) Field of Classification Search
CPC . H01L 23/3672; H01L 23/36; H01L 23/4924; H01L 21/4871
USPC .......................................................... 257/712
See application file for complete search history.

(56) References Cited

U.S. PATENT DOCUMENTS

2007/0090522 A1* 4/2007 Alhayek ............. H01L 23/3677
                                                          257/723
2010/0326645 A1* 12/2010 Fan ........................ B82Y 30/00
                                                          165/185

* cited by examiner

*Primary Examiner* — Tu-Tu Ho
(74) *Attorney, Agent, or Firm* — Taft Stettinius & Hollister LLP; J. Bruce Schelkopf

(57) ABSTRACT

A power electronics module and a method of manufacturing a power electronics module and a base plate. The power electronics module comprising at least one power electronics component, wherein the power electronics module comprises a base plate for transferring heat generated by the at least one power electronics component to a cooling device, the base plate comprising a layered structure having a first copper layer, a second copper layer and a carbon based layer between the first and second copper layers.

10 Claims, 3 Drawing Sheets

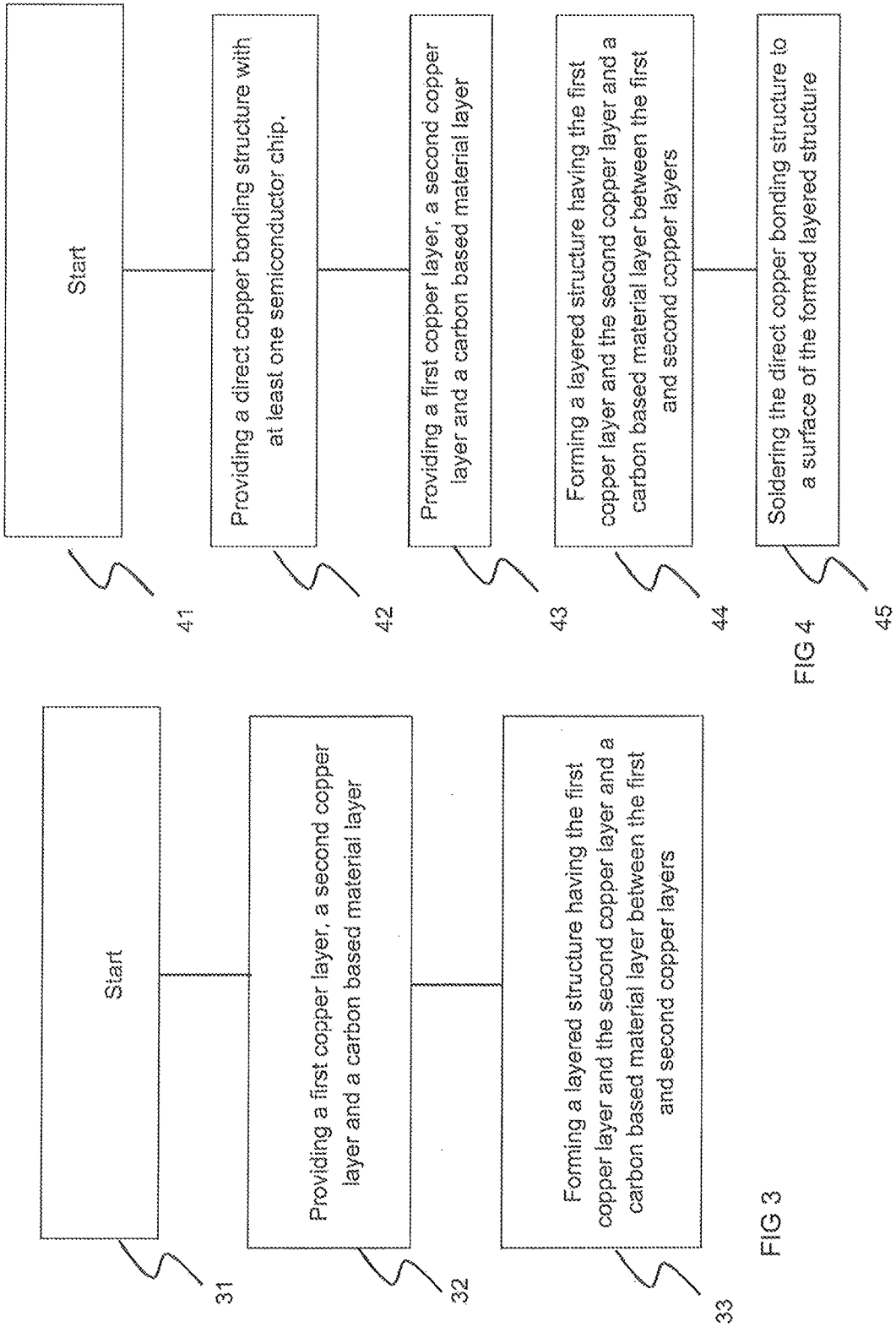

POWER ELECTRONICS MODULE

FIELD OF THE INVENTION

The present invention relates to a power electronics component having a base plate and to a method of manufacturing a power electronics component.

BACKGROUND OF THE INVENTION

Power electronics components, such as single power electronics components or power electronic modules, are commonly used in high powered devices for switching high currents and operating on high voltages. With single power electronics components reference is made to high power thyristors and diodes, for example. Power electronics modules contain multiple of switch components which are situated in a same component housing and typically internally connected to each other to provide a certain circuit structure.

Power electronics modules are used, for example, for producing certain power conversion circuits, such as inverters and converters. An example of a power electronics module contains two IGBTs (Insulated Gate Bi-polar Transistors) which are connected in series inside the module. Other examples may include bridge topologies or parts of bridge topologies which are readily electrically connected inside the module.

Power electronics modules or single power electronics components may also comprise a base plate which is typically made of copper. The purpose of the base plate is to conduct the heat generated by the semiconductors to a cooling device, such as heatsink. The surface of the base plate is typically a substantially planar surface to which a heatsink can be attached. The heatsink is further dimensioned to take into account the amount of heat generated by the semiconductor components in the module.

FIG. 1 shows an example of a cross-section of a power electronics module 1 attached to a heatsink 2. The power electronics module of the example comprises two semiconductor chips 11, 12 which are soldered to a direct copper bonding (DCB) structure. The DCB structure of the example has two copper plates 3 and a ceramic layer 4 between the copper plates 3. The DCB structure is soldered with a solder layer 5 on the top of a copper base plate 7 of the module. The module further comprises a housing 6 which is shown with a dash-dot line surrounding the DCB structure and the chips.

The module of the example of FIG. 1 is attached to a heatsink such that a thermal interface material 8 is positioned between the base plate of the module and the base plate of the heatsink. The purpose of the thermal interface material is to transfer the heat from the module's base plate to the heatsink as effectively as possible. It should be noted that FIG. 1 is provided only to show an example of structure of power electronic module attached to a heatsink. It is clear that other kinds of structures exist.

Power electronics module's internal electronics packing density increases gradually with advanced construction materials and manufacturing methods. This is leading to more challenging module external cooling solutions as devices are able to create very high, over 35 W/cm², hot spots to the heatsink surface.

In view of cooling the situation is most demanding when the module is operated at its maximum current and voltage level i.e. at maximum power. In this condition the conventional aluminium heat sinks' baseplate spreading thermal resistance is too high for the module base plate high heat spots. That is, a conventional aluminium heatsink is not able to spread the heat transferred from the baseplate of the module fast enough. This results in both higher heatsink-to-baseplate temperatures and chip-to-junction temperatures accordingly. Although novel components may allow higher junction temperatures than before due to novel chip material, the component may not be fully utilized unless the power electronics module's external cooling in not at appropriate level.

Common power electronics module external cooling solutions include for example aluminium heat sinks. These conventional solutions are quite sufficient for base plate heat loss densities of typical power electronics modules.

More demanding applications with higher base plate heat loss densities, e.g. over 35 W/cm2, require clearly more effective heat transfer from the base plate. Typically heat transfer is increased for example by increasing cooling air flow rate with larger cooling fans, modifying the aluminium heat sink in different ways like. Modification may include adding a copper heat spreading plate in to the base plate or replacing the heatsink aluminium cooling fins with copper fins. More effective cooling arrangements can be obtained by replacing the aluminium heat sink with heat pipe heat sinks or thermosiphon cooling devices.

Common challenge for these more efficient heat sink and cooling designs is that their cost is significantly higher than conventional aluminium heat sink's. The cost increase derives from several issues like more laborious manufacturing, more complex manufacturing, and higher price materials. It would thus be beneficial to manage the centralized heat loss density within the power electronics module and this way enable use of relatively low cost heat sink solutions.

BRIEF DISCLOSURE OF THE INVENTION

An object of the present invention is to provide a power electronics module and a method of producing a base plate for a power electronics module and of producing a power electronics module so as to solve the above problems. The objects of the invention are achieved by a power electronics module and a method which are characterized by what is stated in the independent claims. The preferred embodiments of the invention are disclosed in the dependent claims.

The invention is based on the idea of producing a novel base plate of a power electronics module. The base plate of a power electronics module comprises a layered structure having copper layers and a carbon based layer between the copper layers. The carbon based layer is preferably graphite layer or graphene layer. The base plate is preferably formed such that copper surrounds the carbon based material layer in all sides of the base plate, and thus the carbon based material forms a core of the base plate.

BRIEF DESCRIPTION OF THE DRAWINGS

In the following the invention will be described in greater detail by means of preferred embodiments with reference to the accompanying drawings, in which

FIGS. 3 and 4 show flowcharts of the methods.

DETAILED DESCRIPTION OF THE INVENTION

Figure 2:
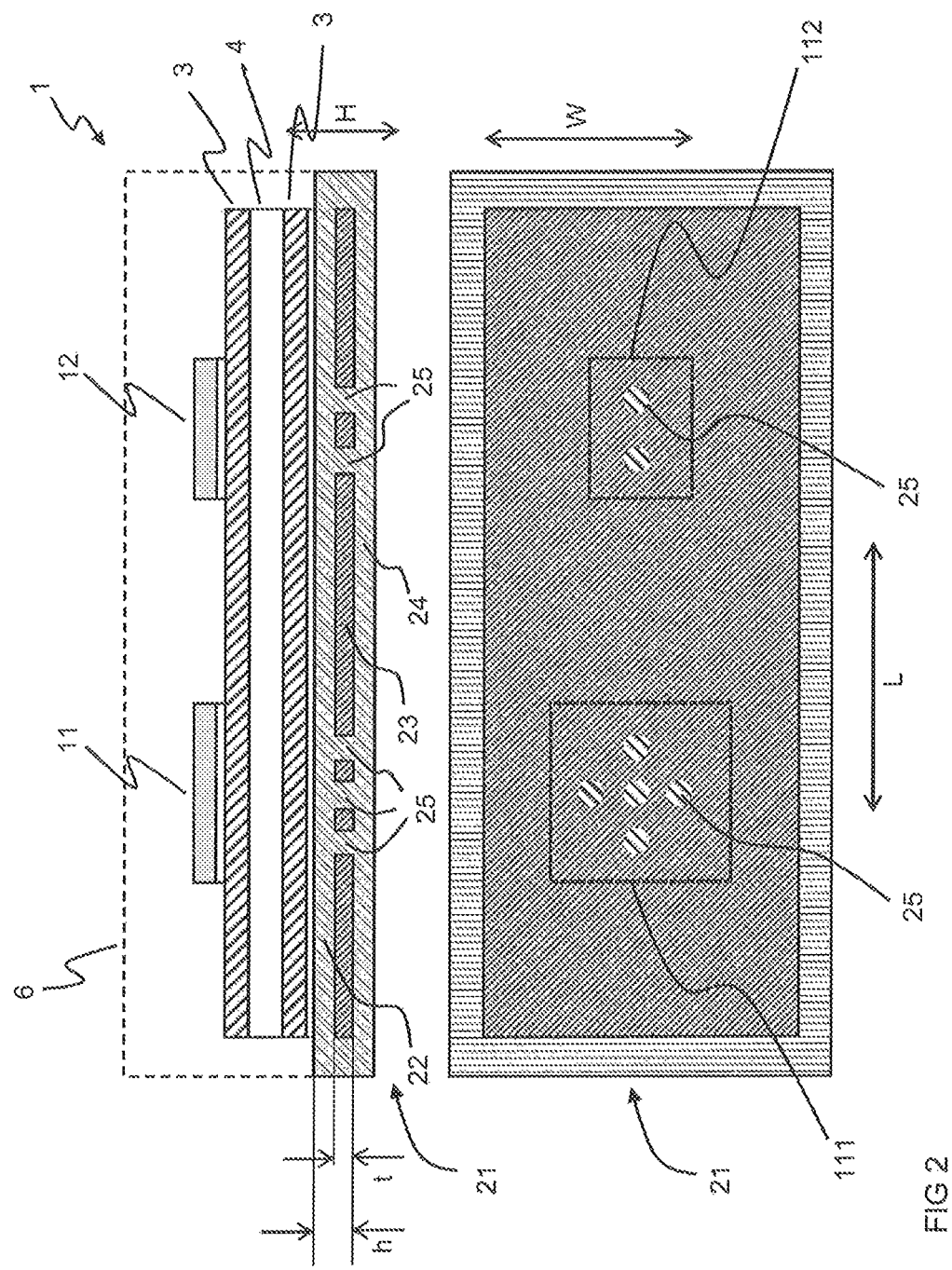
FIG. 2 shows cross sections of an embodiment of the present invention.

FIG. 2 shows cross sectional views of an embodiment of a power electronics module of the present disclosure. The upper drawing of FIG. 2 shows a cross sectional view as seen from the side of the module and the lower drawing of FIG. 2 shows a cross sectional view revealing the inner structure of the base plate of the power electronics module.

According to the present invention the power electronics module comprises at least one power electronic component. In the example of FIG. 2 two power electronics components 11, 12 are shown. Further, the power electronics module comprises a base plate 21 for transferring heat generated by the at least one power electronics component to a cooling device. According to the present disclosure, the base plate comprises a layered structure having a first copper layer, a second copper layer and a carbon based layer between the first and second copper layers.

Figure 1:
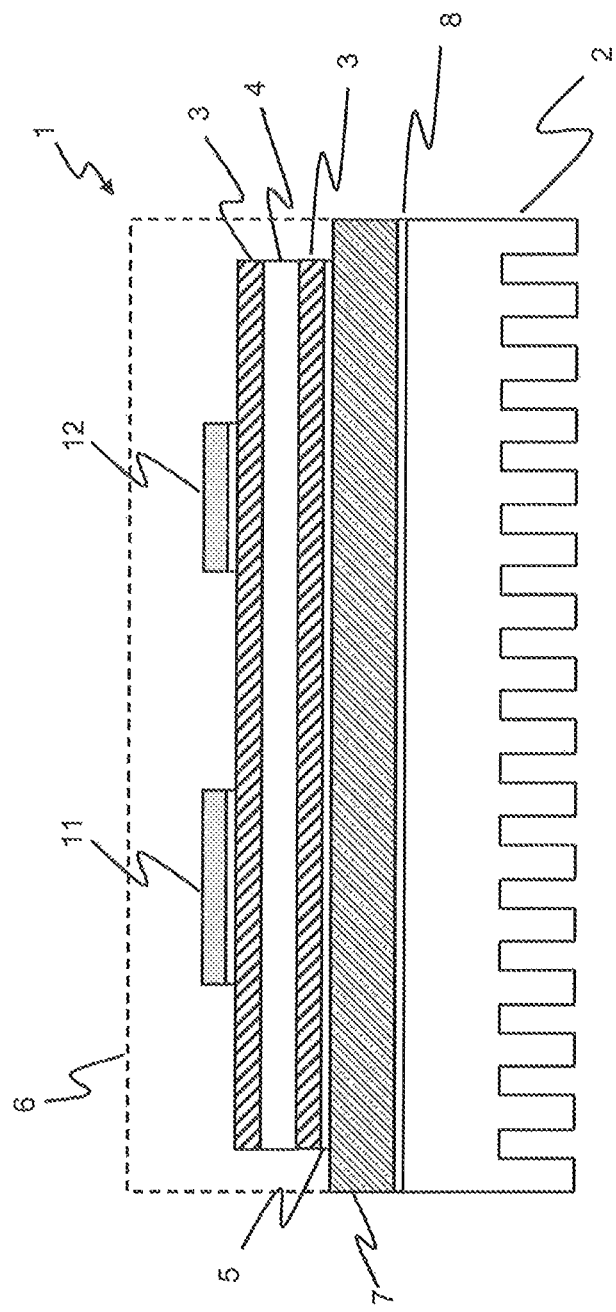
FIG. 1 shows a prior art power electronics module attached to a heatsink.

In the example of FIG. 2, the direct copper bonding structure 3, 4 and the chips 11, 12 are similar as in the example of FIG. 1. In FIG. 2, the base plate 21 which is fastened to the DCB structure 3, 4 of the power electronics module is formed of a layered structure having a first copper layer 22, a carbon based material layer 23 and a second copper layer 24. The carbon based material layer 23 is situated between the two copper layers 22, 24. It shown in FIG. 2 that the copper layers have larger surface areas than the carbon based layer and that the copper layers are fastened to each other in the ends of the layers. For example, the copper layers may be fastened to each other with copper welding. When the copper layers are fastened to each other a carbon based material core is formed within a copper base plate.

When the semiconductor components of the module are used, the losses in the components or chips 11, 12 generate heat. The heat is transferred through the DCB structure 3, 4 to the base plate. The base plate of the invention having a carbon based layer spreads the heat effectively inside the base plate and thus prevents formation of hot-spots in the base plate in the footprint area of the semiconductor chips. With the footprint area of the chips it is referred to the surface area that is directly below chips.

The carbon based material layer is preferably formed from natural graphite, pyrolytic graphite or graphene. This carbon material layer has anisotropic thermal conductivity of approximately 1500 W/mK in-plane and 60 W/mK through-thickness. Thus the material is spreads the heat in the direction of length L and width W effectively. When the heat is spread inside the base plate, the heat is also transferred to the second copper layer 24 from the carbon based layer 23 in the whole surface area of the carbon based layer 23.

A surface of the second copper layer 24 is adapted to receive a cooling device in thermally conductive manner such that the heat from the semiconductor components or chips is led through the base plate to the cooling device such as a heat sink. As the heat is spread in a uniform manner in the base plate, the cooling device does not have to be as effective as in the case with the known base plates.

Preferably the base plate comprises at least one thermal via which is formed of a copper pillar arranged to be in thermal contact with the first copper layer, second copper layer and the carbon based material layer. The thermal via or multiple of thermal vias are arranged preferably within a footprint area a semiconductor chip of the at least one power electronics component.

FIG. 2 shows the thermal vias 25 in the cross sectional views. The cross sectional view from the side of the component (upper drawing) is taken along a line which crosses the thermal vias and therefore the first and second copper layers are shown as being connected. The lower drawing of FIG. 2 is a cross sectional view as seen from below the module and taken along a plane which cuts the carbon based material layer. The lower drawing reveals the structuring of the thermal vias and their position with respect to the footprint of the semiconductor chips. The footprints 111, 112 of the two semiconductor chips 11, 12 are shown as dashed lines in FIG. 2. The thermal vias are situated within the footprints and thus below the semiconductor chips.

The thermal vias are formed preferably from copper pillars which are shown in the Figures to have a circular cross section. The copper pillars are thus cylindrical pieces which are attached to the base plate. The thermal vias provide a thermally highly conductive path below the semiconductors. The copper pillars enhance the thermal conduction into the carbon core of the base plate. Further the copper pillars enhance the thermal conduction through the carbon core or carbon based material layer.

In the invention the base plate is a layered structure which has approximately the same thickness as a conventional base plate which is a solid copper block. For example, if a known a solid copper base plate has a thickness of 4 mm, then the base plate of the module of the invention can be realized in form of two 1.5 mm thick copper plates with a 1.0 mm thick carbon based material layer. The copper pillars used for providing thermal conduction paths can be realized from cylindrical pieces having a diameter of 3 mm, for example. According to an embodiment of the invention, the thickness of the carbon based material layer is approximately one third of the sum thicknesses of the copper layers.

The balance between heat conduction into the carbon core and through the carbon core can be affected with the dimensioning of the thermal vias or copper pillars. Both mentioned features are beneficial for the base plate's effective function and their relative balance is case specific. The balance depends on baseplate total thickness, carbon core's thickness t and relative position h within the copper baseplate, thermal vias' diameter and their count and their location, heat sources' (chips') footprint size and their heat flux profile and chip layout, for example. With the relative position h of the carbon core or carbon layer with the copper base plate it is referred to the distance of carbon based layer from the upper surface of the first copper layer. FIG. 2 shows the relative position h as well as the thickness of the carbon based material layer or core.

The one or more copper pillars used as thermal vias act also as providing physical strength to the base plate. The copper pillars are placed in a hole which is drilled to the layered structure. The holes and the pillars can be dimensioned in such a manner that the pillars are fitted tightly to the corresponding holes and thereby provide support to the structure. Further, the hole or holes that are drilled must not penetrate through both of the copper layers. For example, when a hole is drilled the drill penetrates through the first layer and the carbon based layer. However, the drilling may be ended such that it does not penetrate through the second copper layer.

For providing a suitable surface for thermal connection the copper pillars have a suitable length when attached to the holes. The surfaces of the base plate can also be perforated after the pillars have been inserted such that a required thermal connection can be established between the structure of other components of the power semiconductor module and between the cooling device that is to be attached to the power semiconductor module.

The thermal conductivity of the carbon based material layer is preferably in the range of 1000 W/mK to 1600 W/mK in-plane and 30 W/mK to 100 W/mK through-thickness. Thus the heat is transferred in the planar direction of the carbon based material layer and similarly in the planar direction of the base plate considerably better than in the direction of height of the base plate. Planar direction comprises the directions shown by arrows W and L and the direction of height is shown by arrow H in FIG. 2.

According to an embodiment, the at least one thermal via can also be produced by small particles which are in the carbon based material layer. These particles are preferably nano or micro particles and enhance the thermal conductivity locally in through-thickness direction H. As with the copper pillars, the small particles increase the thermal conduction through the layered structure and to the carbon based material layer.

In the method of manufacturing a base plate for a power semiconductor module a first copper layer, a second copper layer and a carbon based material layer are provided 32 as depicted in FIG. 3. From the separate layers it is formed 33 a layered structure having first copper layer and the second copper layer and a carbon based material layer between the copper layers.

In an embodiment of the method, at least one thermal via is formed to the base plate for enhancing the heat transfer through the layered structure. Preferably the thermal via is formed by drilling a hole to the layered structure and inserting a copper pillar to the drilled hole.

In the method of manufacturing a power electronics module a direct copper bonding structure with at least one semiconductor chip is provided 42. Further, a base plate is provided with the above procedure 43, 44. Further, the provided direct copper bonding structure is soldered 45 to a surface of the formed layered structure, that is to a surface of base plate.

It will be obvious to a person skilled in the art that, as the technology advances, the inventive concept can be implemented in various ways. The invention and its embodiments are not limited to the examples described above but may vary within the scope of the claims.

The invention claimed is:

1. A power electronics module comprising at least one power electronics component, wherein the power electronics module comprises a base plate for transferring heat generated by the at least one power electronics component to a cooling device, the base plate comprising a layered structure having a first copper layer, a second copper layer and a carbon based layer between the first and second copper layers, wherein the base plate comprises at least one thermal via formed of particles contained in the carbon based material layer.

2. A power electronics module according to claim 1, wherein the first copper layer is adapted to receive heat from the at least one power electronics component and a surface of the second copper layer is adapted to receive a surface of a cooling device in thermal contact for transferring heat from the power electronics module to the cooling device.

3. A power electronics module according to claim 2, wherein a surface of the first copper layer is soldered to an inner structure of the power electronics module.

4. A power electronics module according to claim 3, wherein the inner structure of the power electronics module comprises a direct copper bonding structure to which the surface of the first copper layer is soldered.

5. A power electronics module according to claim 1, wherein the base plate is formed by copper welding first and second copper layers together with the carbon based material between the layers.

6. A power electronics module according to claim 1, wherein the at least one thermal via is cylindrical.

7. A power electronics module according to claim 1, wherein the at least one thermal via is situated within a footprint area of a semiconductor chip of the at least one power electronics component.

8. A power electronics module according to claim 1, wherein the at least one thermal via is situated below the semiconductor chip.

9. A method of manufacturing a base plate for a power semiconductor module, the method comprising
 providing a first copper layer, a second copper layer and a carbon based material layer,
 forming a layered structure having the first copper layer and the second copper layer and the carbon based material layer between the first and second copper layers, and
 forming at least one thermal via for enhancing the heat transfer through the layered structure, the thermal via extending through the first cooper layer, the second copper layer and the carbon based material layer, and the at least one thermal via being formed of particles contained in the carbon based material layer.

10. A method of manufacturing a power electronics module, the method comprising
 providing a direct copper bonding structure with at least one semiconductor chip,
 providing a first copper layer, a second copper layer and a carbon based material layer,
 forming a layered structure having the first copper layer and the second copper layer and the carbon based material layer between the first and second copper layers,
 forming at least one thermal via for enhancing the heat transfer through the layered structure, the thermal via extending through the first cooper layer, the second copper layer and the carbon based material layer, and the at least one thermal via being formed of particles contained in the carbon based material layer, and
 soldering the direct copper bonding structure to a surface of the formed layered structure.

* * * * *